(12) United States Patent
Han

(10) Patent No.: US 6,223,418 B1
(45) Date of Patent: May 1, 2001

(54) COATING OF A SUPERCONDUCTOR

(75) Inventor: Zhenghe Han, Farum (DK)

(73) Assignee: Nordic Superconductor Technologies A/S, Brondby (DK)

( * ) Notice: Subject to any disclaimer, the term of this patent is extended or adjusted under 35 U.S.C. 154(b) by 0 days.

(21) Appl. No.: 09/380,115

(22) PCT Filed: Mar. 25, 1998

(86) PCT No.: PCT/DK98/00120

§ 371 Date: Sep. 30, 1999

§ 102(e) Date: Sep. 30, 1999

(87) PCT Pub. No.: WO98/43253

PCT Pub. Date: Oct. 1, 1998

(30) Foreign Application Priority Data

Mar. 25, 1997 (DK) .................................................. 0340/97

(51) Int. Cl.$^7$ .................................................. A01L 39/24
(52) U.S. Cl. .............................. 29/599; 505/230; 505/231
(58) Field of Search .................................. 505/433, 231, 505/230, 121; 29/599

(56) References Cited

U.S. PATENT DOCUMENTS 3,873,799  3/1975  Scheffler .................................. 219/61

FOREIGN PATENT DOCUMENTS

| | | |
|---|---|---|
| 0044144 | 1/1982 | (EP) . |
| 0304116 | 2/1989 | (EP) . |
| 2256080 | 11/1992 | (GB) . |
| 1-013706 | * 1/1989 | (JP) . |
| 1-059726 | * 3/1989 | (JP) . |
| 1-158754 | * 6/1989 | (JP) . |
| 9082146 | 3/1997 | (JP) . |

* cited by examiner

Primary Examiner—Carl J. Arbes
(74) Attorney, Agent, or Firm—Ladas & Parry

(57) ABSTRACT

A method of preparing a metal tube for a length of superconducting wire Inserts superconducting base material into the tube and packs or coils the tube so that a portion of its outer surface would contact another surface. To prevent the portion of the outer surface from sticking to the other surface, the portion is coated with powder material particles suspended in an effectively liquid component before the packing or coiling so that the surfaces do not contact each other. The powder material has a melting point temperature higher than the melting point temperature of the tube and the liquid component evaporates or burns away completely at the temperature that forms the superconducting phase of the superconducting base material.

16 Claims, 1 Drawing Sheet

COATING OF A SUPERCONDUCTOR

The present invention relates to a method of manufacturing a superconducting length of wire, comprising at least insertion of a superconducting base material into a tube of metal and subsequent packing or coiling of the metallic tube in such a manner that a first part of the outer surface of the tube contacts a second part of the surface of the tube, following which the metal tube filled with the superconducting base material is heated to a temperature close to the melting point temperature of the metal tube so as to form the superconducting phase of the base material.

This method is normal in the manufacture of superconducting lengths of wire, there being hereby formed a tube having suitable mechanical properties in which the superconducting material is enclosed. In this connection, the superconducting material is formed by e.g. a powder material which, after the insertion into the metal tube, does not per se cause the length of wire to become superconducting, but which is activated after the subsequent heat treatment so that the length of wire becomes superconducting.

However, a problem of the above-mentioned heat treatment is that for practical reasons the conductor not heat treated yet is packed or more expediently coiled so that the length of wire is easier to handle. As a consequence, the subsequent heat treatment of the packed or coiled length of wire may make it impossible to unpack or unwind the length of wire, because the length of wire adheres to itself in the regions where the first area on the length of wire contacts the second area.

A known solution to this problem is one wherein a ceramic tape is used in the coiling of the length of wire not heat treated yet, said tape being coiled together with the length of wire so that no areas on the length of wire contact other areas on the length of wire during coiling. Subsequent unwinding of the heat treated length of wire may hereby be performed without any risk of the superconducting length of wire adhering to itself.

EP A2 44 144 discloses a method wherein the superconducting length of wire is provided with an insulating layer consisting of a silicate and another component capable of reacting with said silicate to form a ceramic layer by heating to temperatures above 500° C., following which the layer is dried and heat treated at the above-mentioned temperature to form the insulating ceramic article.

Since the insulating layer will form an insulating surface which is sticky at said temperatures, this method does not lend itself for heat treatment of superconducting lengths of wire which have e.g. been coiled into a coil and which are subsequently to be unwound from said coil and then used in a production.

It is moreover known from JP 09082146-A to manufacture a superconducting length of wire with a coating of nickel oxide or zirconium oxide by placing the tube of silver filled with the superconducting base material in an outer tube of nickel or zirconium, following which the two tubes are drawn to a reduced diameter for a substantially round wire which is subsequently rolled and heat-treated so as to form the superconducting phase in the superconducting base material, said outer tube forming a layer of nickel oxide or zirconium oxide.

The resulting tube may very well be wound into e.g. a coil without the outer coatings adhering to each other in an optional heat treatment, but the process clearly requires a relatively accurate process control to ensure that the outer layer of metal oxide has a reasonable uniform thickness, particularly if an outer layer of a very small thickness is desired.

A problem of this prior art is thus that the ceramic tape is difficult to handle, or that its thickness causes a coil containing a given length of conductor to be relatively large.

Accordingly, the object of the present invention is to provide a method of manufacturing a superconducting length of wire of the type stated in the opening paragraph, which does not necessitate the use of a ceramic tape to separate the individual layers of the conductor not heat treated yet in the packing or coiling of it, thereby achieving a method which lends itself for heat treatment of superconducting lengths of wire in a compact coiled or otherwise packed state, following which the superconducting length of wire may be unwound again and be used in a production process.

This is achieved according to the invention in that the tube of metal, before being packed or coiled, is provided with a liquid coating on at least the first and second parts of the outer surface of the tube, said coating comprising a substantially liquid component which evaporates or burns completely at the temperature at which the superconducting phase in the superconducting material is formed, and a powder material suspended in the liquid component and having a melting temperature which is higher than the melting temperature of the metallic tube.

This allows formation of a very thin layer of material on the conductor not heat treated yet, said layer ensuring that, during coiling or packing, the first outer area on the metal tube does not contact the second outer area on the meal tube in the heat treatment, while e.g. a coil of a given length of the conductor is not very bulky.

In a preferred embodiment, the coating applied to the length of wire comprises a ceramic material, in particular a metal oxide preferably selected from the group: $Al_2O_3$, $CR_2O_3$, $Cu_xO_y$, $Ni_xO_y$, $Zn_xO_y$, $Zr_xO_y$, $Ta_cO_y$.

Alternatively, the coating may advantageously be formed by the application of a metal oxide powder. It may be applied particularly simply as a paint consisting of a liquid medium in which the metal oxide powder is suspended.

It is expedient in this connection if the metal oxide powder is suspended in an amount ensuring that the individual metal oxide particles, when applied to the first and second outer surfaces of the metal tube, are disposed in a density such that metal oxide particles on the first outer surface of the metal tube do not touch the second outer surface of the metal tube, and vice versa.

In addition, the liquid medium for the suspension of the metal oxide powder may expediently comprise a solvent, such as acetone, alcohol or toluene, admixed with an amount of polymer, such as polyvinyl butyral (PVB), and polyvinyl butyral is advantageously added in an amount of between 0.1 and 10 per cent by weight, preferably between 1 and 4 per cent by weight, as this provides suitable adhesion properties for the liquid medium and the suspended metal oxide powder.

Tests have shown that zirconium oxide may preferably be used as the metal oxide powder, but other ceramic powders and particularly metal oxides may be used.

The invention will be described more fully below with reference to the drawing, in which.

Figure 1:
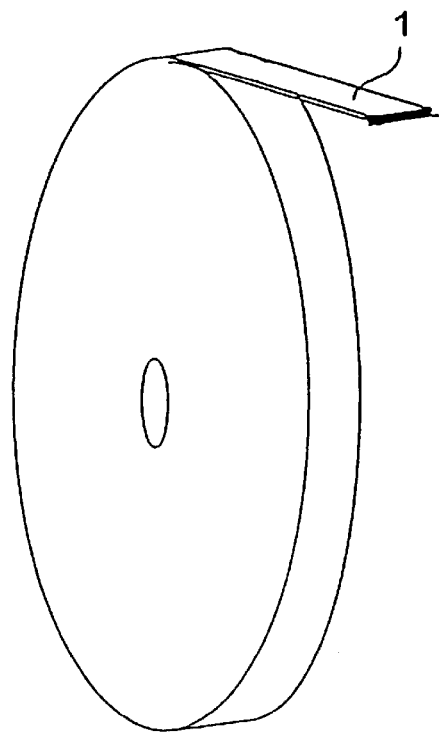
FIG. 1 is a basic view which shows a coiled conductor containing superconducting material.

FIG. 1 thus shows a conductor containing superconducting material. As will be seen, the conductor is wound around a core with a view to heat treatment.

The wound conductor 1 may be manufactured according to a generally known method by filling a tube 2 with superconducting material 7 and then stretching, drawing or otherwise machining it in order to reduce the cross-sectional dimensions of the tube 2. In particular, this manufacturing process may comprise a rolling process or other process which provides a conductor in the form of a tape having a desired thickness. Such manufacturing processes are generally known from the literature and will therefore not be described in detail here.

The product, however, is a conductor containing a superconducting base material, which subsequently requires a heat treatment to form the superconducting phase in the base material.

Owing to the handling of the conductor, the conductor is coiled or packed into e.g. a coil 1, as shown in FIG. 1, and then the heat treatment may be initiated.

This heat treatment frequently requires the use of temperatures close to the melting temperature of the tube 2, so that, if the coiled conductor 1 has surfaces 3, 4 touching each other, as shown, then it is likely that the surface of the tube 3 will fuse or melt together with the other surface 4 on the conductor.

Figure 2:
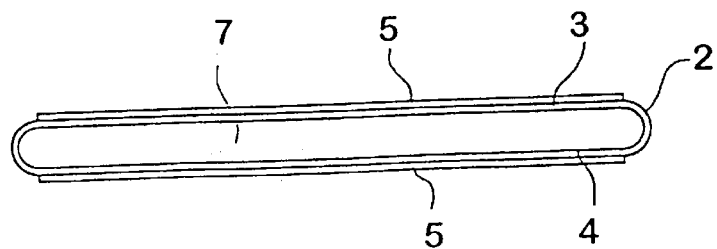
FIG. 2 is a basic view which shows a cross-section through the conductor shown in FIG. 1 in a first embodiment.
Figure 3:
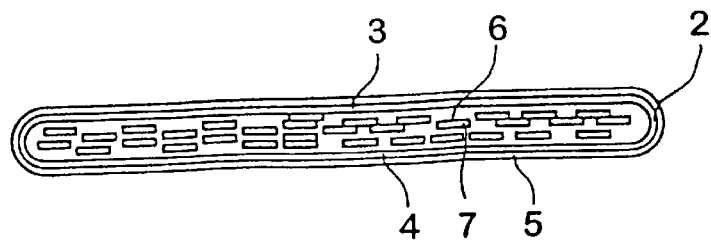
FIG. 3 is a basic view which shows a cross-section through the conductor of FIG. 1 in a second embodiment.

This is remedied according to the invention, as shown in FIGS. 2 and 3, by providing the tube 2 with an outer coating 5 before the tube is coiled into a coil or is otherwise packed with a view to the subsequent heat treatment, said coating 5 having a melting temperature which is higher than the melting temperature of the material of which the tube 2 is made.

FIG. 2 thus shows a first embodiment of the invention in which the tube 2 itself contains a superconducting base material, but the surfaces 3 and 4 of the tube are covered by a coating 5 of ceramic material selected from the group of materials having the basic formula $M_xO_y$, where M is a metal, such as Cu, Ni, Al, Zn, Zr, Sr, Mn, Ta, etc., and where O is oxygen.

In embodiments of the method, the coating 5 may be provided by e.g. applying a paint which comprises the desired ceramic material suspended in a liquid, such as a solvent in the form of acetone, alcohol or toluene, admixed with an amount of polymer, such as polyvinyl butyral (PVB).

Alternatively, the ceramic coating 5 may be applied as a powder, or it may be formed by simple oxidation of the material of the tube 2.

FIG. 3 shows a second embodiment of the invention in which the tube 2 is filled with rows of filament tubes 6, which are in turn filled with a superconducting base material 7. In the same manner as shown in FIG. 2, the conductor shown in FIG. 3 is provided with a ceramic coating 5, but here, in contrast to the embodiment shown in FIG. 2, the coating is applied so that it covers the entire circumference of the tube 2.

Clearly, in view of the basic idea of the present invention, a skilled person will be able to devise other embodiments of conductors which are provided with a coating to protect against fusing of the coiled conductor. Thus, the present invention may be applied in connection with conductors having other cross-sections than e.g. those shown in FIGS. 2 and 3, both as regards the outer cross-sectional dimensions and the internal structure of the tube.

What is claimed is:

1. In a method of preparing a metal tube for a length of superconducting wire comprising inserting a superconducting base material into the metal tube, the metal tube having an outer surface, and packing or coiling the metal tube so that a portion of the outer surface of the metal tube would contact another surface, whereby heating the superconducting base material and metal tube to a temperature that forms of the superconducting phase of the superconducting base material, the temperature being sufficiently close to the melting point temperature of the metal tube, would cause the portion of the outer surface of the metal tube to adhere to the other surface, the improvement comprising:

coating the portion of the outer surface of the metal tube with powder material particles suspended in an effectively liquid component before the packing or coiling so that the portion of the outer surface of the metal tube does not contact the outer surface after the packing or coiling, the powder material having a melting point temperature higher than the melting point temperature of the metal tube, and the liquid component evaporating or burning away completely at the temperature that forms the superconducting phase of the superconducting base material.

2. The method according to claim 1, wherein the powder material is a metal oxide.

3. The method according to claim 1, wherein the coating is such that the particles do not touch the other surface after the packing or coiling.

4. The method according to claim 2, wherein the coating is such that the particles do not touch the other surface after the packing or coiling.

5. The method according to claim 1, wherein the liquid component comprises a solvent admixed with a polymer.

6. The method according to claim 1, wherein the liquid component comprises a solvent admixed with a polymer.

7. The method according to claim 3, wherein the solvent comprises at least one of acetone, alcohol or toluene.

8. The method according to claim 6, wherein the solvent comprises at least one of acetone, alcohol or toluene.

9. The method according to claim 3, wherein the polymer comprises polyvinyl butyral.

10. The method according to claim 8, wherein the polymer comprises polyvinyl butyral.

11. The method according to claim 9, wherein the polyvinyl butyral comprises from 0.1 to 10 percent by weight of the liquid component.

12. The method according to claim 10, wherein the polyvinyl butyral comprises from 0.1 to 10 percent by weight of the liquid component.

13. The method according to claim 2, wherein the metal oxide powder material comprises at least one of $Al_2O_3$, $CR_2O_3$, $Cu_xO_y$, $Ni_xO_y$, $Zn_xO_y$, $Zr_xO_y$ or $Ta_xO_y$.

14. The method according to claim 12, wherein the metal oxide powder material comprises at least one of $Al_2O_3$, $CR_2O_3$, $Cu_xO_y$, $Ni_xO_y$, $Zn_xO_y$, $Zr_xO_y$ or $Ta_xO_y$.

15. The method according to claim 2, wherein the metal oxide powder material comprises Zr.

16. The method according to claim 15, wherein the metal oxide powder material comprises Zr.

* * * * *